(12) United States Patent
Wagner

(10) Patent No.: US 7,546,556 B1
(45) Date of Patent: Jun. 9, 2009

(54) VIRTUAL SHAPE BASED PARAMETERIZED CELL

(75) Inventor: Todd J. Wagner, Los Altos Hills, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/426,470

(22) Filed: Apr. 29, 2003

(51) Int. Cl.
*G06F 17/50* (2006.01)

(52) U.S. Cl. ............................................ 716/1; 716/17

(58) Field of Classification Search ................. 716/1–5, 716/7–11, 17–18, 19; 430/5
See application file for complete search history.

(56) References Cited

U.S. PATENT DOCUMENTS

| | | | |
|---|---|---|---|
| 6,209,123 B1* | 3/2001 | Maziasz et al. ............... | 716/14 |
| 6,539,533 B1* | 3/2003 | Brown et al. .................. | 716/17 |
| 6,574,786 B1* | 6/2003 | Pohlenz et al. ................ | 716/17 |
| 6,804,809 B1* | 10/2004 | West et al. .................... | 716/11 |
| 2002/0160278 A1* | 10/2002 | Winder et al. ................. | 430/5 |
| 2004/0010762 A1* | 1/2004 | Habitz ........................... | 716/4 |

OTHER PUBLICATIONS

Moetti, Gabe, "Graphical Editor Speeds Process Deployment," EDN Magazine, Oct. 26, 2000, p. 30.

* cited by examiner

*Primary Examiner*—Paul Dinh
(74) *Attorney, Agent, or Firm*—Vista IP Law Group, LLP.

(57) ABSTRACT

A method of designing an electric circuit includes generating a part of the design, determining a virtual shape based on the part, and using the virtual shape to generate a design for an additional part. Design elements of the additional part, such as its size, location, or orientation for example, may be determined with the virtual shape. The method may also generate multiple virtual shapes based on the part, and may use one or more of the multiple virtual shapes to generate the next part. The method may be repeated to generate additional parts of the design using virtual shapes.

43 Claims, 17 Drawing Sheets pcell macro mos_core min= {CONT.W1} + 2 * {CONT.E.1}
s1= {CONT.C.1} - {CONT.E.1}
s2= {POLY1.C.1} if leftAbut < 2 if (_w >= min)

if(_w < min)

NON-DOGBONE CASE
522

DOGBONE CASE
520 pcell macro mos_core if leftAbut >=2

530 a2 = max((0.5 * {POLY1.S.1}+gridfix) {POLY1.C.1})
a3 = 0.5 * {POLY1.S.1}+gridfix
a4 = max((0.5 * {POLY1.S.1}+gridfix) {POLY1.C.1})
a5 = {POLY1.S.1}
a6 = {CONT.C.1} - {CONT.E.1}
S0 = case( leftAbut
          (2 a2)
          (3 a3)
          (4 a4)
          (5 a5)
          (6 a6))

pcell macro mos_core

2: for i 2 fingers if (_w >= min)

542 if (_w < min)

544 pcell macro mos_core

3: include if rightAbout < 2 if (_w >= min)

552

553 if (_w < min)

554 pcell macro mos_core

3: include if rightAbut >=2

562 a2 = max((0.5 *{POLY1.S.1}+gridfix) {POLY1.C.1})
a3 = 0.5 *{POLY1.S.1}+gridfix
a4 = max((0.5 *{POLY1.S.1}+gridfix) {POLY1.C.2})
a5 = {POLY1.C.1}
a6 = {CONT.C.1} - {CONT.E.1}
s0 = case( rightAbut
         (2 a2)
         (3 a3)
         (4 a4)
         (5 a5)
         (6 a6))

pcell macro mos_core cs={CONST.S.1}
me1={M1.E.1}
me2={M1.E.2}
mw={CONT.W.1} + 2 * {M1.E.1}
mul= 2 * {CONT.W.1} + {CONT.S.!} + 2 * {CONT.E.1}

5: for i 1 fingers+1    580 if ((i>1 && i<fingers+1) || (i==1 && leftAbut<2) ||
(i==fingers+1 && right Abut<2))

if _w >= mul

582 if _w < mul && _w >= min

583 if _w < min

586 if evenp(i)

584 if oddp(i)

585

PCELLS nmos pcell macro nmos_core pcell cds020_pcell nmos

| formal parameters | | |
|---|---|---|
| w | string | CDF |
| l | string | CDF |
| fingers | int | CDF |
| leftAbut | int | CDF |
| rightAbut | int | CDF | include macro mos_core
include macro nmos_core

VIRTUAL SHAPE BASED PARAMETERIZED CELL

FIELD OF THE INVENTION

The invention is related to the field of electronic circuit design, and more specifically, to the field of automatically generating components of an electronic circuit design.

BACKGROUND OF THE INVENTION

Circuit designers can create a design using a graphical tool to generate circuit components. The graphical tool may include parameterized cells (pcells) to allow the designer to include parameters on the circuit components. For example, the designer may specify parameters on components such as resistors or capacitors, and the pcell tool can then generate representations of the components based on the specified parameters.

Traditional graphical tool systems support very simple conditional and iterative constructs. The simple conditionals and simple iterations are useful when generating a simple component such as a symmetrical device. For example, a resistor that is generated using a traditional system can have a number of up fingers that is equal to a number of down fingers. However, the traditional systems are unable to support complex conditionals or complex iterations. Therefore, a complex component cannot be created using the traditional systems.

SUMMARY OF THE INVENTION

A method of designing an electronic circuit using one or more virtual shapes includes identifying a component of the circuit, the component having a plurality of parts, selecting a current design part of the component, determining a virtual shape based on the current design part, and generating a next design part of the component based on the virtual shape. The method may also generate multiple virtual shapes based on the part, and may use one or more of the multiple virtual shapes to generate the next part. The method may be repeated to generate additional parts of the design using virtual shapes.

DETAILED DESCRIPTION

A virtual shape is used to provide information, such as size, location, or orientation, about a shape used in a component of an electronic circuit. For example, the virtual shape can represent alignment information for the corresponding shape so that the shape is properly aligned and connected to adjacent elements. The virtual shape can also serve as a placeholder for a shape that is generated elsewhere during a process of designing an integrated circuit. The virtual shape can be used to determine a size of a shape, to extend a pcell to another portion of a display (such as a pcell displayed on a computer screen or a pcell printed on one or more pages of paper, for example), and to perform conditionals and iterations.

The virtual shape may have a name and an index, and the index can be a numeric expression. Simple and complex conditionals and iterations can be applied to virtual shapes during the design process to specify which graphical shapes to use to determine the location of one or more additional shapes. Examples of conditional expressions include: if the index value of a given virtual shape is odd, then generate a shape based on a first master shape at a given location; if the index value is even, then generate a shape based on a second master shape. Alignment information is provided by the virtual shape to generate the appropriate shape at the proper location of the design.

A layout of a design for an integrated circuit may be automatically generated using a virtual shape based parameterized cell (pcell) device generator. Each pcell of the device generator includes a graphical tool to specify parameters for the components of the cell. The virtual shapes of the pcells can be used to automatically generate simple and complex components of the design. For example, a component may have multiple parts, where each part can be generated by reproducing one of several master shapes. The design of the component may be automatically generated by using an iterative process that selectively places the shapes adjacent to one another. During a given iteration, a given shape to be produced at a given location in the design may be selected from the master shapes by applying the index value of the corresponding virtual shape to a conditional expression. This allows the virtual shape based pcell generator to automatically construct pcells that have circuit components such as CMOS single- and multi-gate transistors, resistors, and capacitors.

Figure 1:
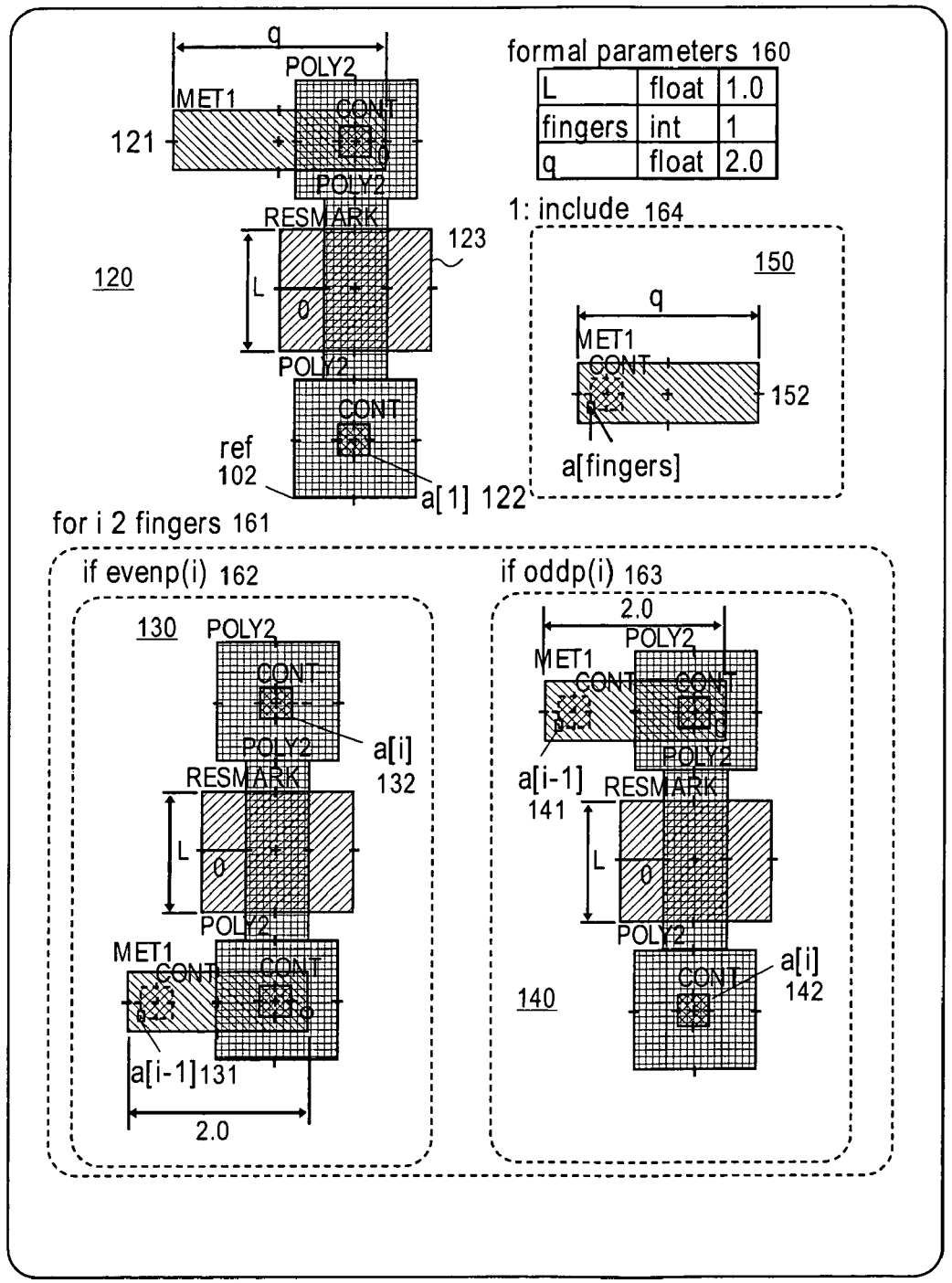
FIG. 1 shows an example of a representation of segments of a resistor including virtual shapes.

FIG. 1 shows examples of segments with virtual shapes that are used to automatically generate the electronic representation of a resistor. As shown in FIG. 1, segment 120 extends from shape 121 to shape 122 thru a series of contacts and interconnect. Segment 130, begins with virtual shape 131 and extends to shape 132. Virtual shape 131 is used to provide alignment information for segment 130, and refers to shape 122 on the first iteration. Similarly, segment 140 begins with virtual shape 141 and ends with shape 142. Virtual shape 141 refers to shape 132 on the previous iteration, and virtual shape 131 will refer to shape 142 on even iterations after the first iteration.

Parameterized data may be specified by the user to minimize the effort of entry and editing, as well as to reduce design rule violations. Any kind of layout data can be parameterized. For example, with a transistor pcell, the length, width, number of gate segments, and other design elements of the transistor, can be realized by simply inserting or changing one or more parameter values. For bipolar designs, parameterized data can include shapes such as arcs and circles. Design data can include text, and the location of the text may be relative to a virtual shape. Also, pieces of parameterized data can automatically appear, disappear, or replicate as a condition of another parameter.

For example, several parameters are specified in the pcell of FIG. 1. To generate a pcell instance, a library name, cell name, instance name, orientation, and the type and values of parameters are specified. Library and cell names 101 show an example of specified library and cell parameters. The pcell includes a formal parameter table 160, where each row of the table contains a pcell parameter name, parameter type (such as float, integer, Boolean, or string), and a default value. The parameters in this example include L, which specifies a length of a resistor segment; fingers, which specifies the number of fingers of the resistor; and q, which specifies a length of first and last connecting wires.

As shown in FIG. 1, parameters may be used to set a size of each parameterized cell shape (pshape). The parameters may be included in an expression having constants, formal parameters, and design rule identifiers. If a length or a width of a rectangle is not provided, a value may be found by searching the design rules. This may also be done to find values for a width of a path, a sub-path, or an arc. For example, as shown in FIG. 1, the poly width is a minimum poly width. A poly length may be the p-type diffusion (pdiff) length plus two times the poly to pdiff enclosure value. The pdiff sizes may be determined by this method also. The cont value may be a minimum contact size, and a met1 may represent an enclosure of metal layer 1 and a contact.

The pshapes include alignment points. Vertices and points marked with a + are valid alignment points, including vertices and + points on a path centerline. As shown in FIG. 1, alignments may be drawn between alignment handles of two pshapes. Alignment values may be expressed in terms of dx and dy. No dx and dy values defaults to zero for both, and * is used to indicate the design rule value. If the alignment points are on top of each other and there are no values (0 0), a large dot is shown. For example, a center bottom of poly may be aligned with a center top of met1. Poly may be aligned horizontally to pdiff using a spacing rule such as a poly to pdiff spacing rule for example.

A reference point 102 is used to determine an initial location of a pcell. The starting point may be identified with specific coordinates, or a default starting point of (0, 0) will be used. Pshapes may have names and the names may have one or more indices. The indices may be integers, variables, or expressions.

Control blocks are used to specify conditionals and iteration. Control blocks may also have an integer order number. This allows the user to specify which control blocks are processed before other control blocks, because one control block may be dependent on the output from another control block. The include control block may be used to force the ordering on parts of a pcell. For example, the parts in FIG. 1 control block 161 "for i 2 fingers", which is equivalent to "0: for i 2 fingers", are generated before the parts in control block 164 "1: include." Control blocks may also have a name. This allows the control block to be continued on additional pages, using virtual shapes to refer to shapes inside the control block on previous pages.

Any pshape may be set to a virtual shape, and the boundary of the virtual shape may be represented by dotted lines. Virtual shapes are not output, but may be used as a place holder to determine sizes and locations of other pshapes. For example, a poly length may be determined by using a virtual shape to represent a pdiff from another part of the pcell that will overlap the poly. Virtual shapes may be used when continuing a pcell definition or control block over multiple pages. Virtual shapes may also allow a segment to be generated using an iterative process.

The complex representation of a component, such as a resistor, can be created using virtual shapes to perform complex conditionals and iterations. FIGS. 2A, 2B, 2C, and 2D show an example of a resistor that is automatically generated using the representation of resistor parts as shown in FIG. 1. Because the resistor 200 is generated using virtual shapes, the number of down fingers, such as fingers 210, 230, and 250 as shown in FIG. 2D, can be greater than the number of up fingers, such as fingers 220 and 240.

After FIG. 1 segment 120 is used to generate finger 210 as shown in FIG. 2, additional segments of resistor 200 are selected and placed into the design based on an index value of a virtual shape. The index value of a virtual shape may be based on a variable or expression such as the iteration number for the generation of the previous segment. During a given iteration, the index value is applied to one or more conditional expressions to select the appropriate shape to generate. For example, the following conditional expressions may be used during the generation of a resistor as shown in FIGS. 2A, 2B, and 2C, to produce the resistor of FIG. 2D. The first expression may be: if the iteration number i is even, then shapes based on segment 130 as shown in FIG. 1 are generated. The second expression may be: if the iteration number is odd, then shapes based on segment 140 are generated. Because the resistor 200 have five segments, the process generates the four segments after segment 120 by alternately generating shapes based on segment 130 and shapes based on segment 140 for four iterations, where one segment is generated during each iteration.

Additional conditional expressions, or commands, may be used to indicate actions to be performed during each iteration to produce the resistor of FIG. 2D. As shown in FIG. 1, pcell control commands may include for, if, and include commands, for example. The include command 164 may be used so that a second terminal is output after other control blocks. The for and if blocks 161, 162, and 163 may have order zero (default), so that they are processed before the include command 164, which has an order of one. The if blocks 162 and 163 within for block 161 may be unordered, thus using the default order of 0, since even and odd are mutually exclusive. The for command 161 may use an iterator i, followed by integer expressions for an initial value and a final value of i. For example, the expression "for i 2 fingers" specifies the for command, an initial iteration number of 2, and a final iteration number of fingers. Segments 130 and 140 are used by for i 2 fingers command 161 to generate a shape for each iteration. An appropriate selection of either part 130 or part 140 may be performed with the if commands 162 and 163. Each if command may use any Boolean expression. For example, to generate the resistor 200 of FIG. 2D, the segment 130 is used when the "if evenp(i)" command 162 is satisfied, and the segment 140 is used when the "if oddp(i)" command 163 is satisfied.

Figure 2A:
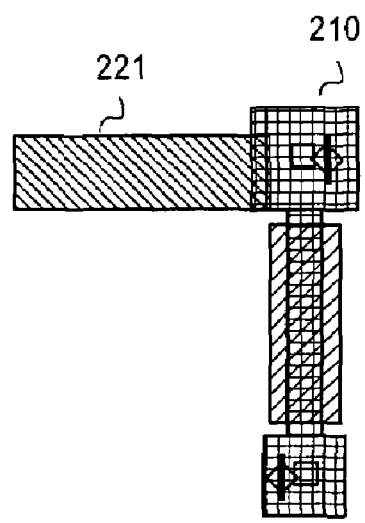
FIGS. 2A, 2B, 2C, and 2D show an example of an electronic design for a resistor pcell that is automatically generated using the segments with virtual shapes of FIG. 1.
Figure 2B:
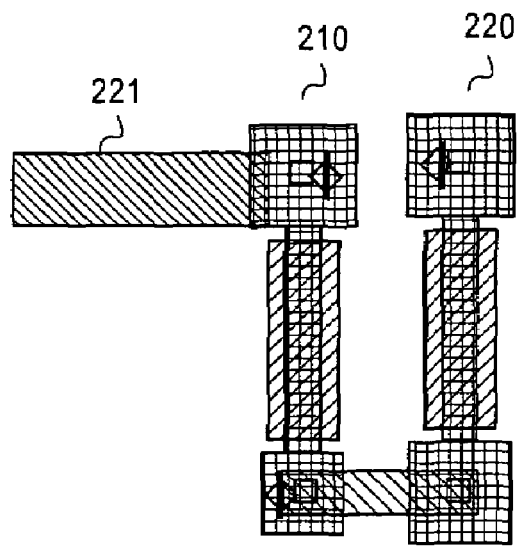

The process initially generates segment 210 with connecting wire 221 as shown in FIG. 2A based on section 120 of FIG. 1. Then, the first control block of FIG. 1, which is labeled "for i 2 fingers" 161, is processed. During the first iteration of the "for" conditional, the iteration number i is two, which is an even number. The iteration number is applied to the "if" conditional expressions 162 and 163, and satisfies the first conditional expression 162. Therefore, the second generated segment 220 has the shape of segment 130, as shown in FIG. 2B. The index number for virtual shape 131 will be one, and a[1] is shape 122 in FIG. 1.

Figure 2C:
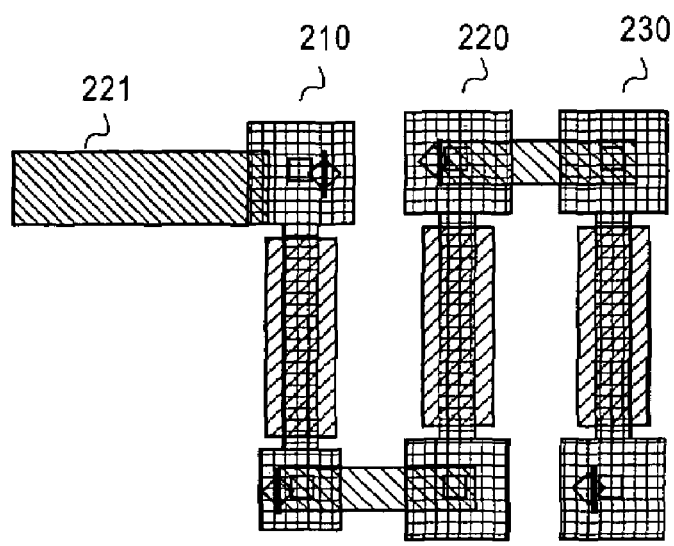
Figure 2D:
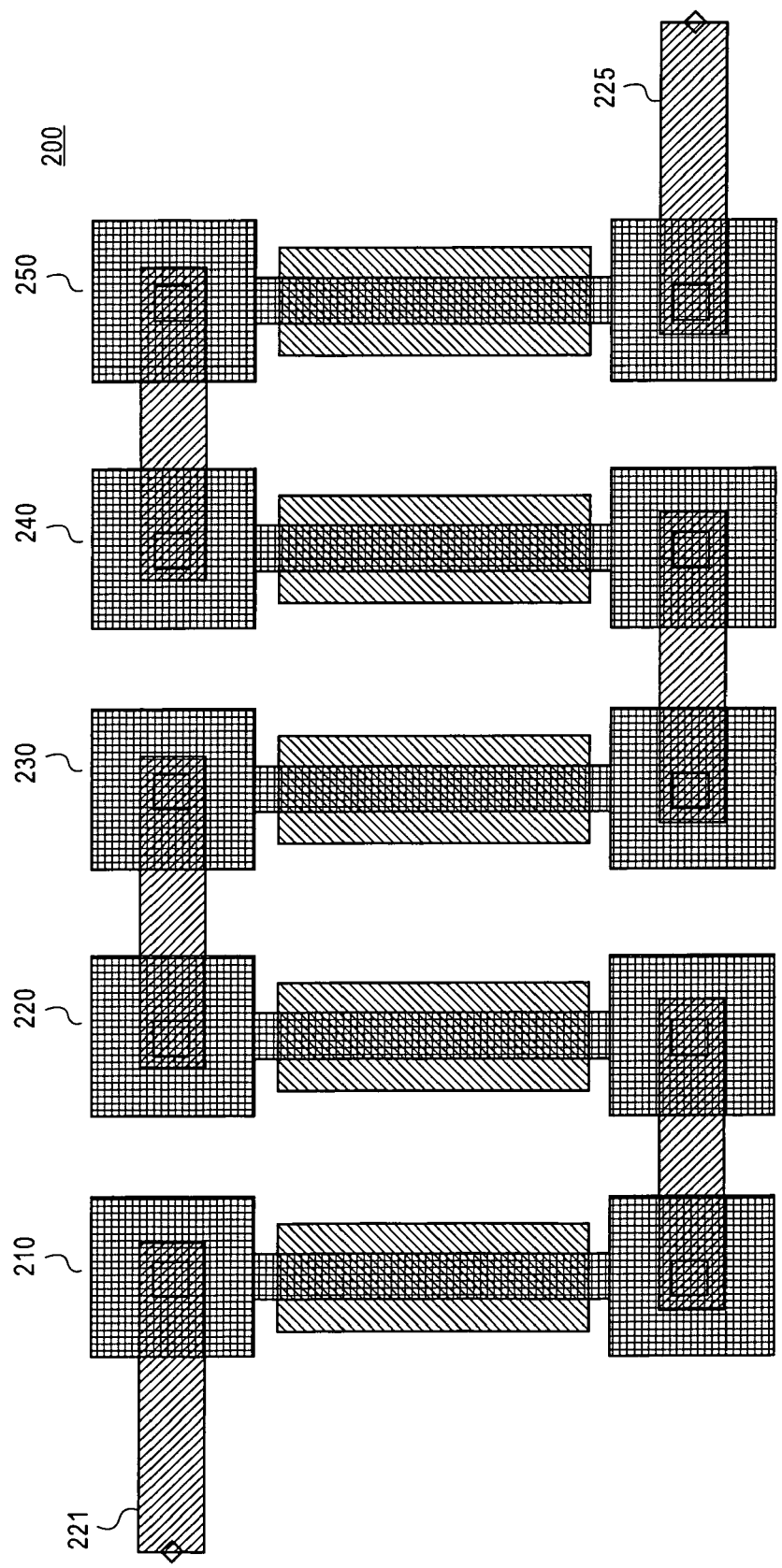

During the second iteration, the iteration number is three, which is an odd number. The process applies the iteration number to the conditional expressions, and determines that the second expression is satisfied. The process then generates part 230 based on the segment 140 associated with odd index values, as shown in FIG. 2C. The index number for virtual shape 141 is two, and a[2] is shape 132 in FIG. 1 from the previous iteration. During the third iteration, the iteration number is four, and the index number of the virtual shape 131 is three, so once again segment 130 is generated as part 240 of FIG. 2D. Virtual shape 131 in FIG. 1 refers to shape 142 from the previous iteration using the name a[3].

The fourth iteration, with iteration number five, generates part 250 of the resistor in FIG. 2D, using segment 140 when virtual shape 141 refers to shape 132 using the name a[4]. After the fourth iteration, the execution of the "for" command 161 for control block 0 is finished. The next control block in FIG. 1, which is labeled "1: include" 164, is then processed. The include conditional adds connecting wire 225 to the resistor of FIG. 2D by referring virtual shape 151 to shape 142 using the name a[5], and then connecting to wire 152.

The index of a virtual shape can be any integer expression, so complex structures are easily supported. FIG. 2D is an example of a complex structure in which odd numbered iterations 1, 3, 5, use a different construct than is used in even numbered iterations 2, 4.

Figure 3:
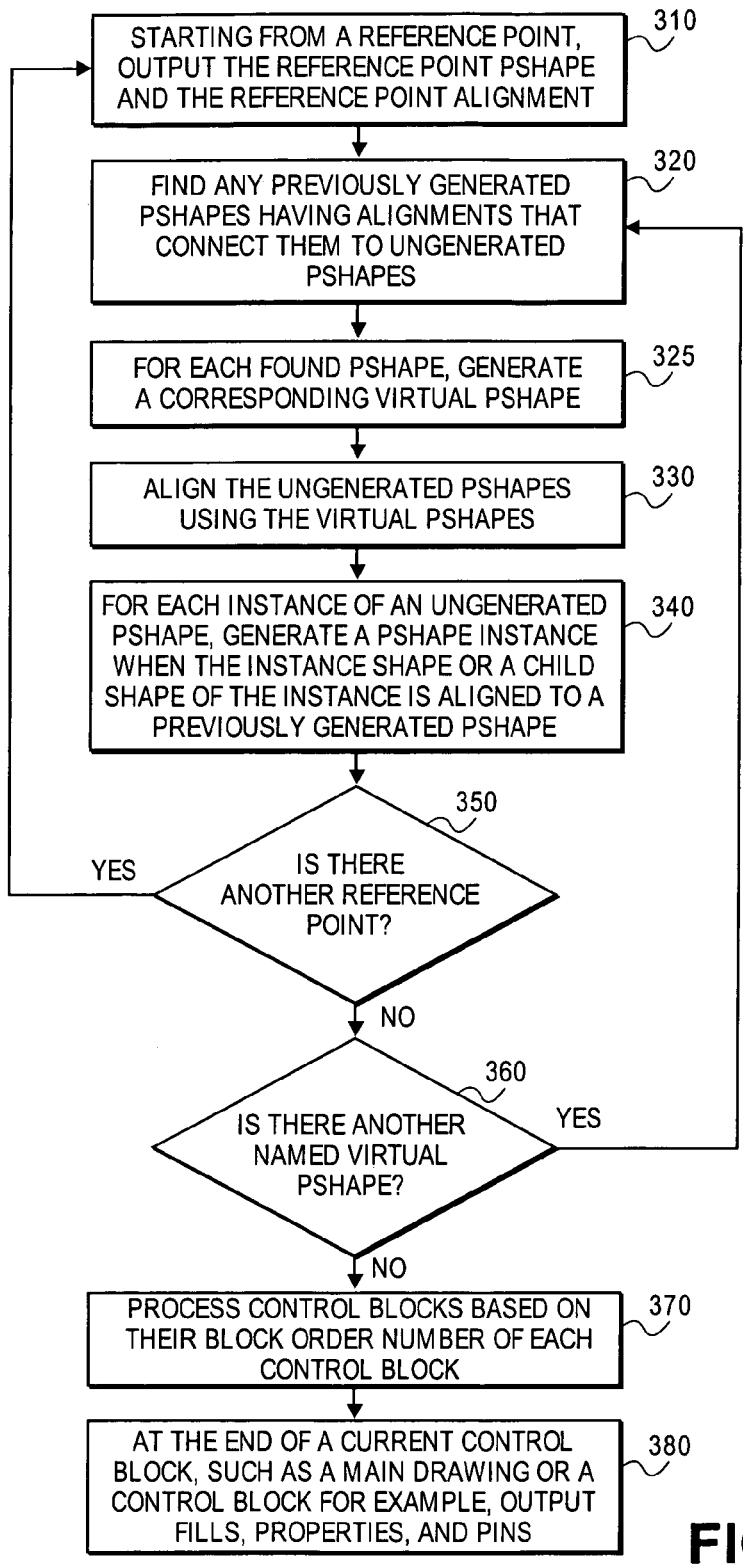
FIG. 3 shows an example of a method of generating a representation of a component using virtual shapes.

FIG. 3 shows an illustration of a method of automatically generating an electronic design using virtual shapes. Starting from a reference point, output the reference point pshape and the reference point alignment, so that there is at least one reference point in a pcell, 310. This may be performed for each reference point. Find any previously generated pshapes having alignments that connect them to ungenerated pshapes, 320. For each found pshape, generate a virtual pshape, 325. Each virtual pshape includes information about the corresponding generated pshape, such as alignment information for example. Align the ungenerated pshapes using the virtual pshapes, 330. For example, if generated shape has an alignment for connecting it to an ungenerated pshape, a corresponding virtual shape is generated and includes the alignment information. The virtual pshape is then used to align and connect the ungenerated pshape to the virtual shape's previously generated pshape. This may be performed until the alignments of the ungenerated pshapes are connected to previously generated pshapes. For each instance of an ungenerated pshape, generate a pshape instance when the instance shape or a child shape of the instance is aligned to a previously generated pshape, 340. Whether an ungenerated pshape is aligned to a generated pshape may be determined using the virtual pshape of a previously generated pshape. A pshape instance of an ungenerated shape may be generated based on information from a virtual pshape. Also, fit shapes may be generated when alignments are available. The process returns to 310 for each reference point, 350. When there are no additional reference points to be processed, the process returns to 320 for each named virtual pshape, 360. Control blocks are processed based on the control order number of each control block, 370. At the end of a current control block, such as a main drawing or a control block for example, output fills, properties, and pins, 380. In one embodiment, a virtual shape may be represented by a dotted outline and have no fill color.

Figure 4A:
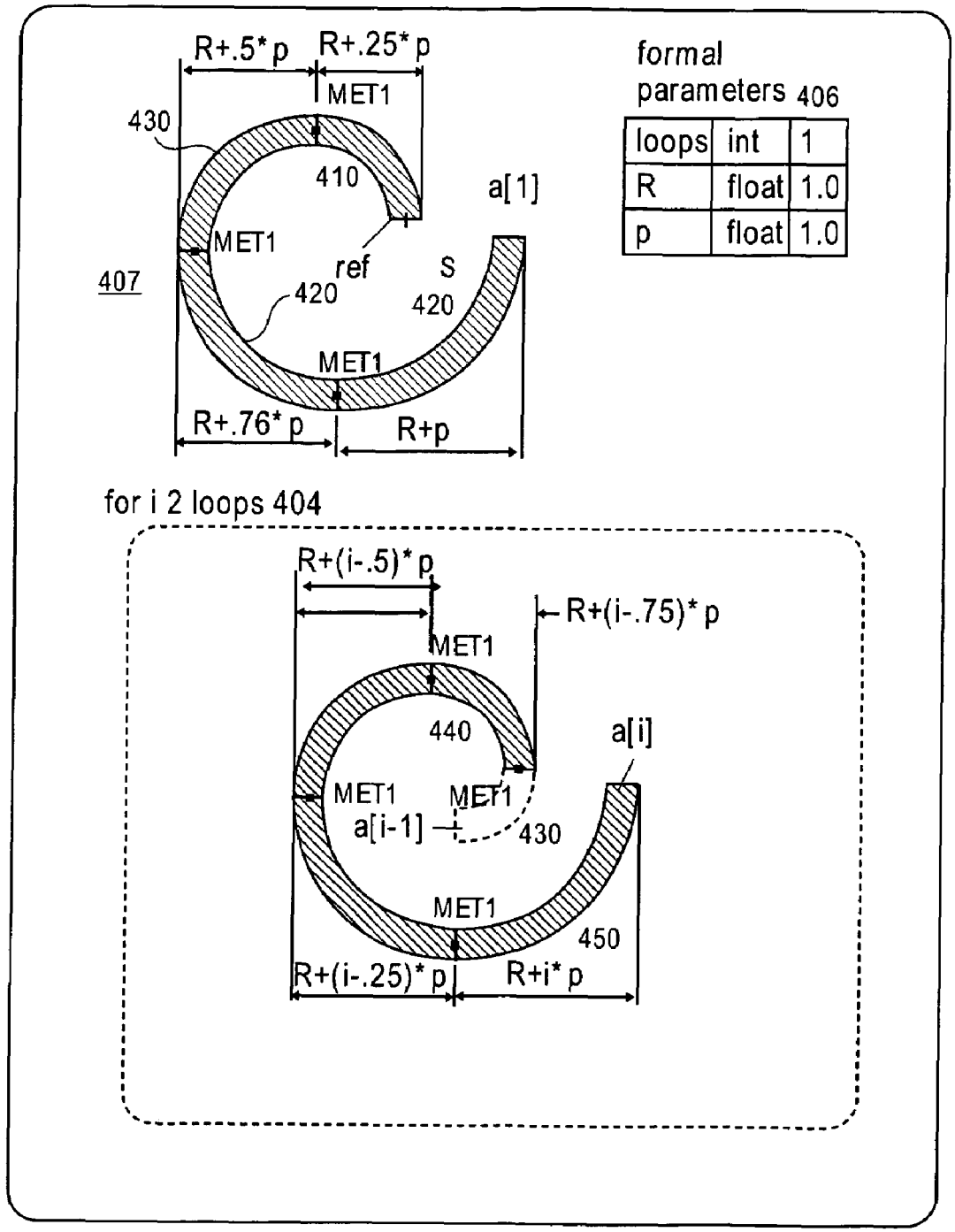
FIG. 4A shows an example of a representation of segments for a spiral inductor including virtual shapes.

In addition to complex iterations, virtual shapes may be used with simple iterations. An example of a simple iteration with a virtual shape is generating a number n of identical constructs where a given shape is generated during each iteration. For example, FIG. 4A shows an embodiment of simple iterations that use virtual shapes to generate an electronic design for an inductor. After the first loop 407, an iteration expression 404 uses virtual shapes to generate additional loops of the inductor. Parameter box 406 is used to specify one or more parameters of the inductor. For example, parameters for the number of loops, the radius, and the pitch (width plus spacing) are specified. The loops parameter may be 2, and the radius and pitch parameters may be 1.0. Then, part 407 will create the first loop and a single iteration is used to generate the rest of the inductor, as shown by the iteration statement "for i 2 loops." The position of segment 410 is determined by the reference point. The radius of each segment may be determined based on an expression involving the radius, pitch, and loop number. After part 407 is output, shape 420 will be named a[1].

Figure 4B:
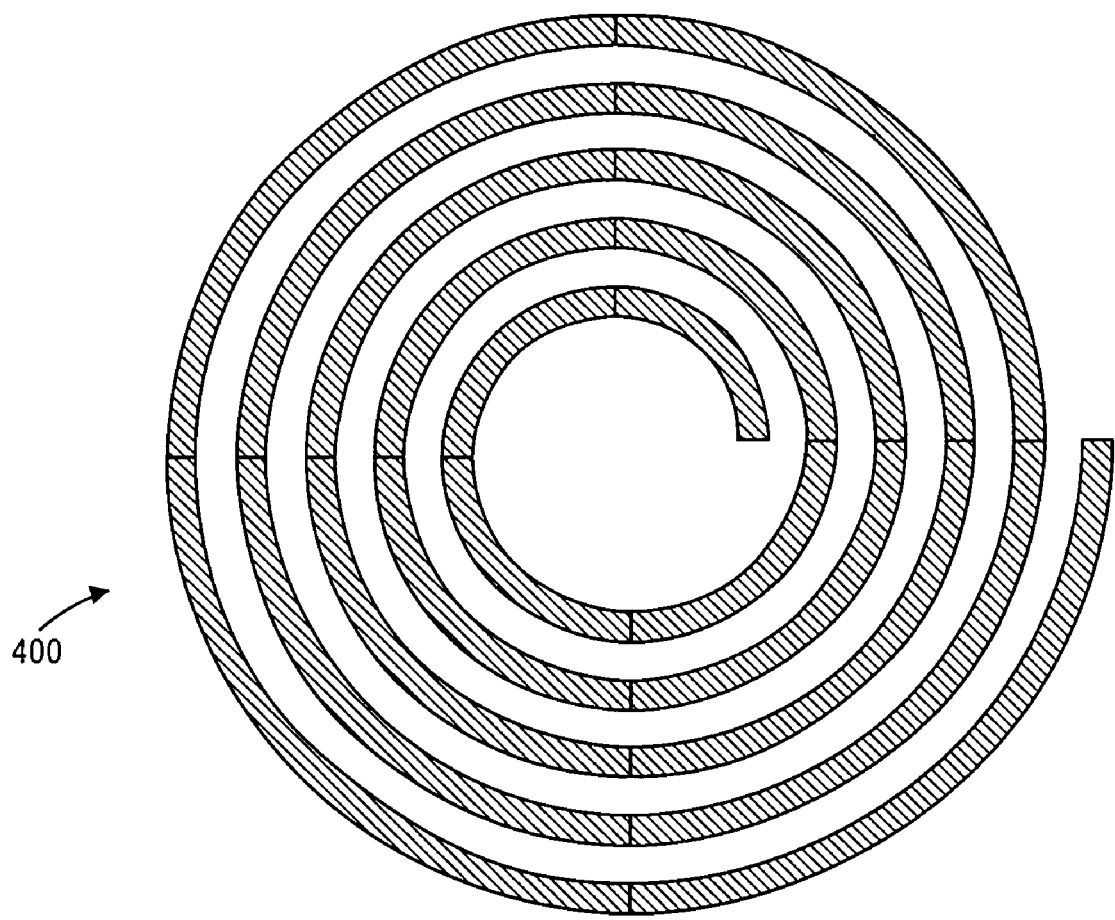
FIG. 4B shows an example of a spiral inductor generated from the virtual shapes of FIG. 4A.

During the first iteration, virtual shape 430 refers to shape 420 using the name a[1]. Shapes 440 thru 450 are then generated and shape 450 will get the name a[2]. For any additional iterations virtual shape 430 will refer to shape 450 from the previous iteration. These processes may be repeated to generate the spiral inductor 400 as shown in FIG. 4B.

Figure 5A:
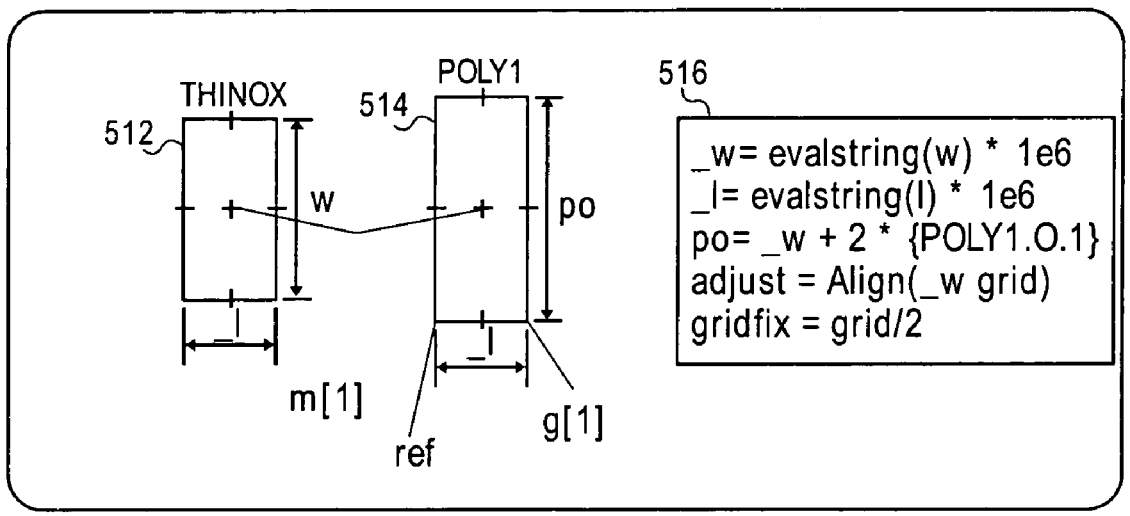
FIGS. 5A through 5I show examples of segments of a transistor generated with virtual shapes.

The virtual shape based pcell generator may also generate a design of a single- or multi-gate transistor. For example, FIGS. 5A through 5I show embodiments of pcells with virtual shapes that are used to automatically generate a design of a multi-fingered MOS transistor shown in FIG. 5J. FIG. 5A shows shapes 512 and 514 which represent the first poly gate and the diffusion underneath the gate. These shapes serve as a base for a MOS pcell generation method. For example, the shape 512 is used to generate virtual shapes in subsequent areas of the method. Local assignments 516 may be used to convert the CDF strings into floating point numbers. (A component description format (CDF) may be used with pcells to ensure parameter consistence across several applications. The CDF automatically associates the legal parameters and their default values with a pcell as it is instantiated. This reduces the need for repeated data input, and thus reduces the opportunity to introduce errors.)

Figure 5B:
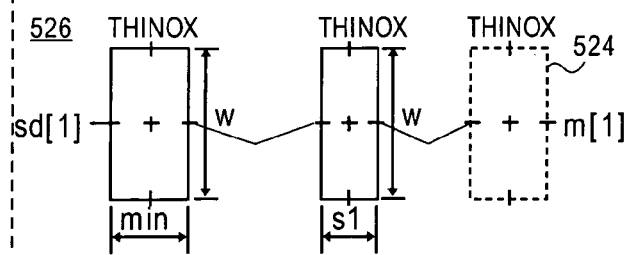
Figure 5B:
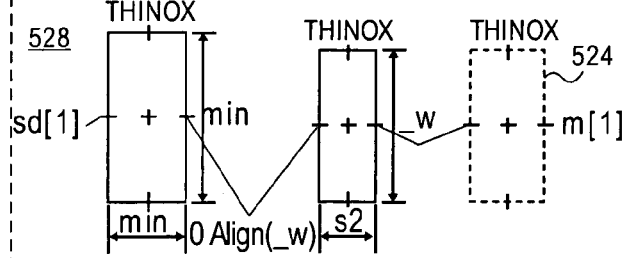
Figure 5B:
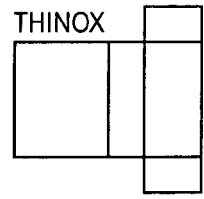
Figure 5B:
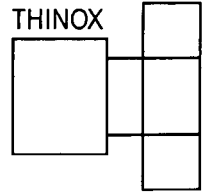

FIG. 5B shows pcell segments used to build a side, such as a left side for example, of the transistor using virtual shapes. The diffusion shape 512 from FIG. 5A is referenced using virtual shape 524. The side is built when the "if left abut<2" condition is satisfied. The elements in block 526 are generated when "if_w>=min" is satisfied. The elements in block 528 are generated when "if_w<min" is satisfied. The segments in blocks 526, 528 handle generation of the non-dogbone 522 and dogbone 520 structures, as well as abutment without losing end diffusion.

Figure 5C:
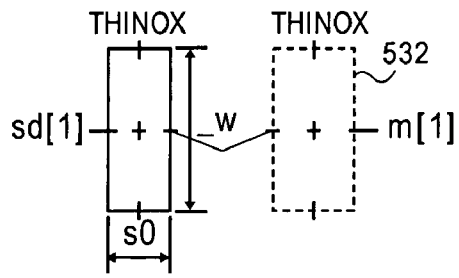

FIG. 5C shows another example of a pcell that is used to build a side, such as the left side for example, of the transistor using virtual shapes. The diffusion shape 512 is referenced with virtual shape 532. The segment 530 is built when "if left abut>=2" is satisfied, to generate an abutment that loses end diffusion. The case "if" statements in FIGS. 5B and 5C are used to account for the different abutment states.

Figure 5D:
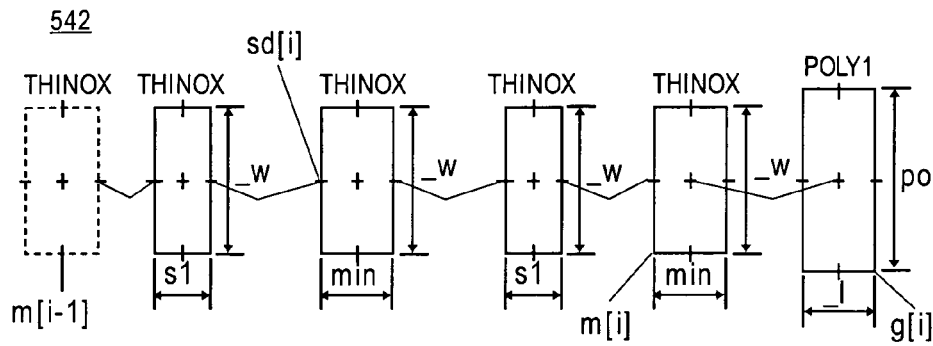
Figure 5D:
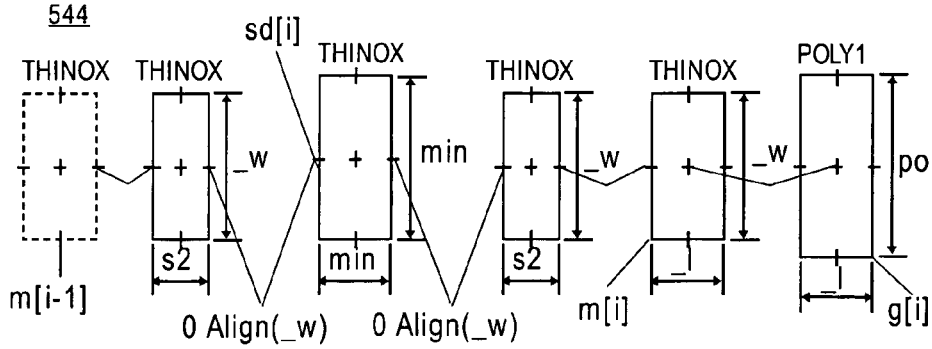

Control blocks 2 through 6 as shown in FIGS. 5D through 5I are processed based on the control order number of each control block. As shown in FIG. 5D, control block 2 includes a "for" statement "for i 2 fingers." The "for" statement includes two conditions, "if _w>=min" then the components of block 542 are generated; and "if_w<min" then the components of block 544 are generated.

Figure 5E:
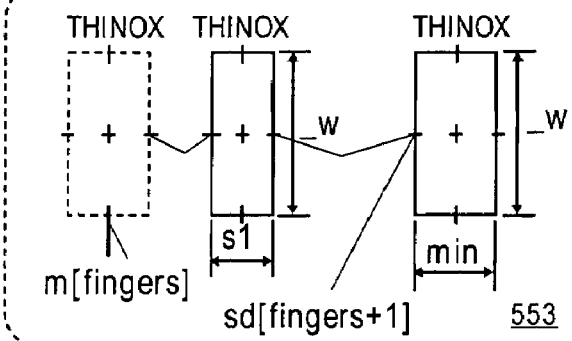
Figure 5E:
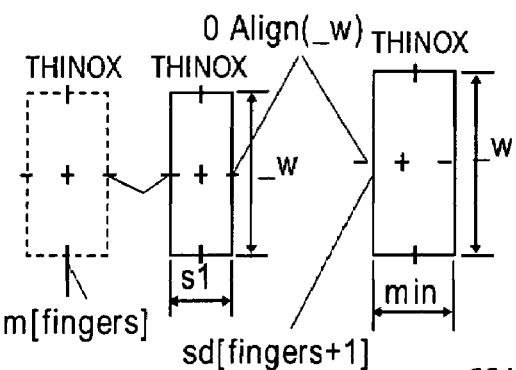
Figure 5F:
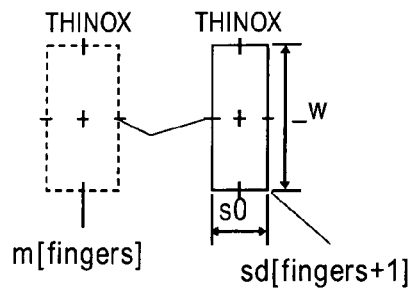

As shown in FIGS. 5E and 5F, control block 3 has an "include" statement with two conditionals, "if right abut<2" then one of the cells in block 552 is generated. Block 552 contains two conditional statements, "if_w>=min" then cell 553 is generated, and "if_w<min" then cell 554 is generated. FIG. 5F shows control block 3 with an "include" statement which is used with the "if" statement "if right abut>=2" is satisfied to generate the elements of block 562.

Figure 5G:
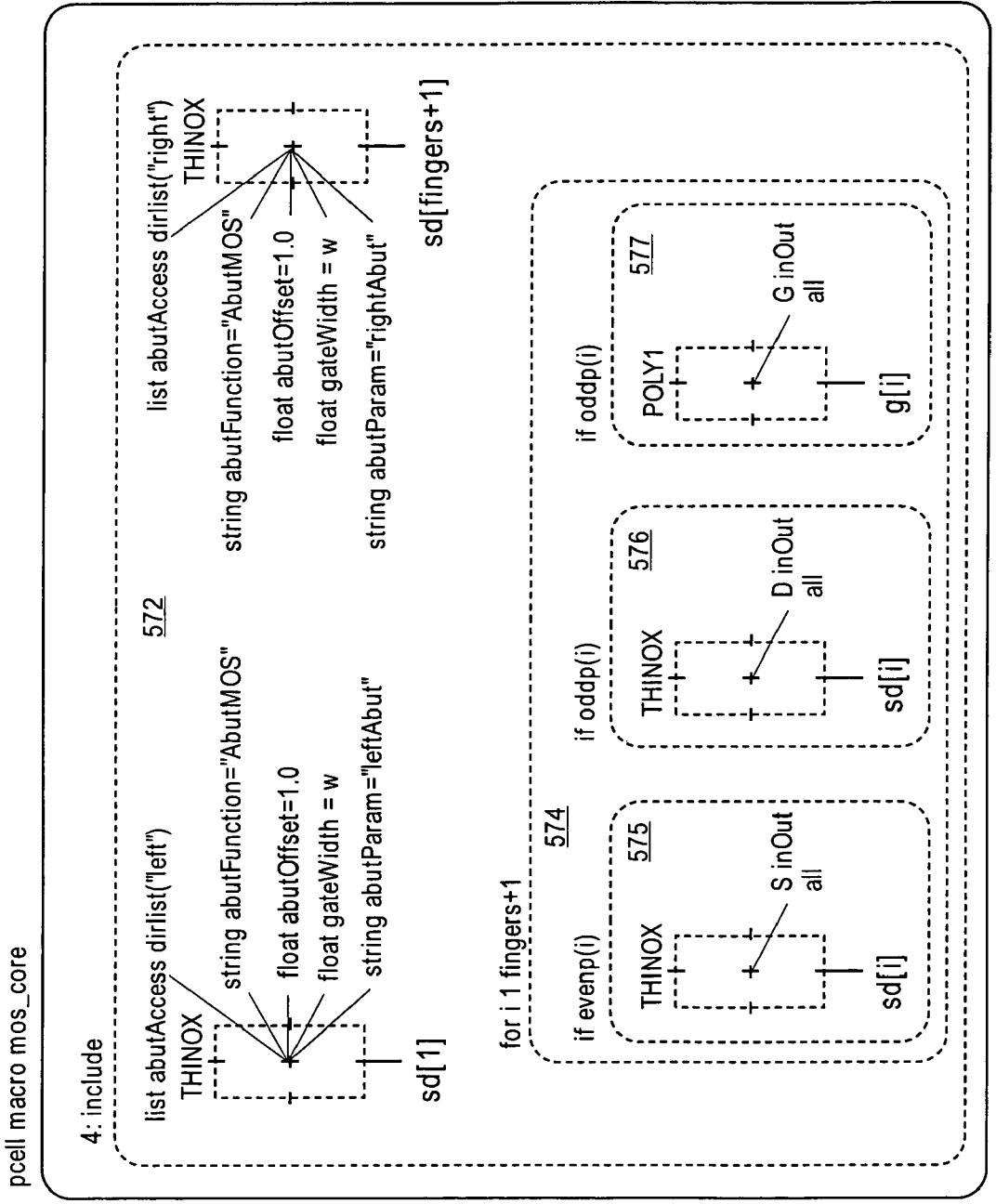
Figure 5H:
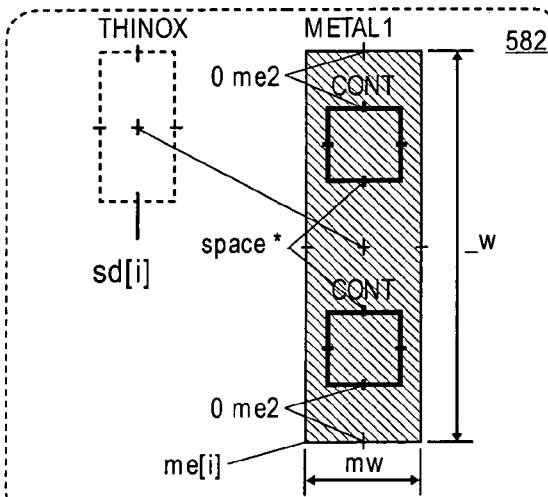
Figure 5H:
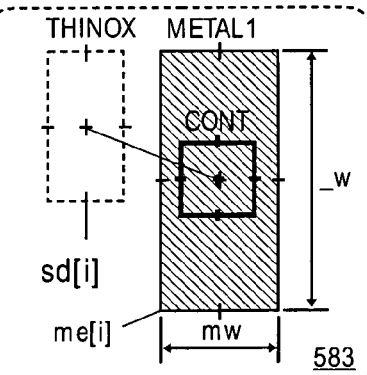
Figure 5H:
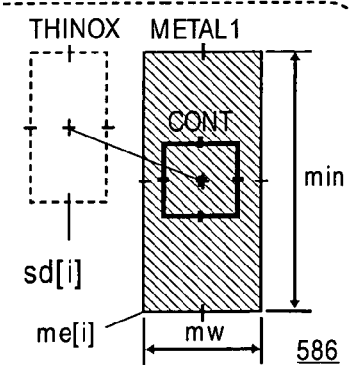
Figure 5H:
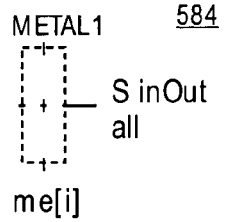
Figure 5H:
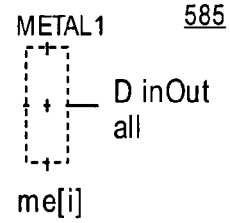
Figure 5I:
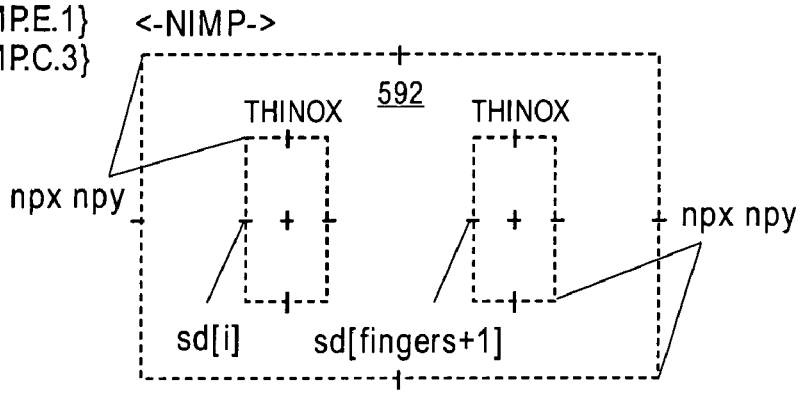
Figure 5J:
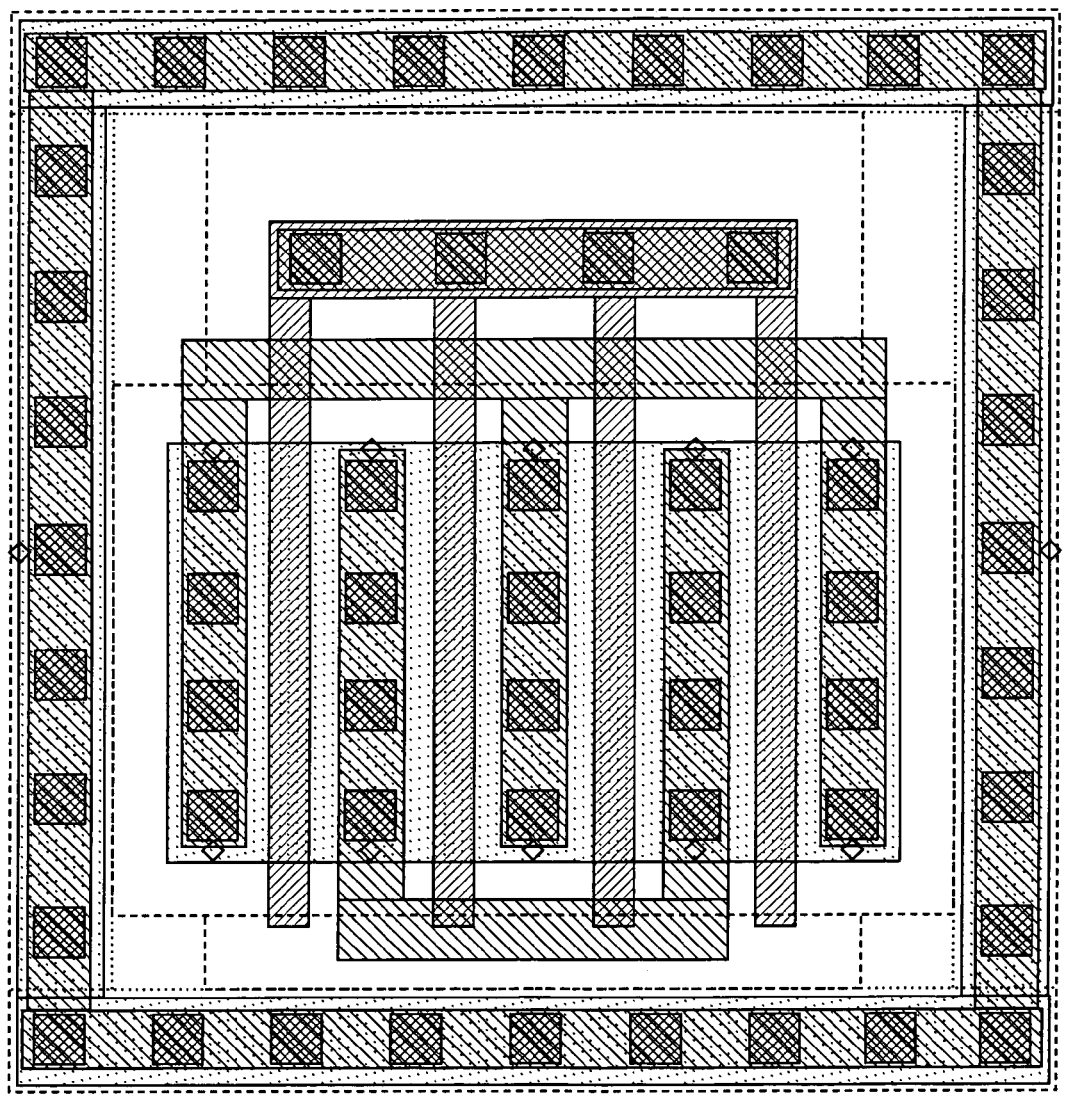
FIG. 5J shows an example of a transistor generated from the virtual shapes of FIGS. 5A through 5I.

FIG. 5G shows an example of control block 4, which generates block 572. Block 574 generates block 575 when i is even, and blocks 576 and 577 when i is odd, for i values from one to fingers+1. FIG. 5H process block 580 for i values from one to fingers+1. When "if _w>=mul" is true block 582 is generated, when "if_mul &&_>=min" is true block 583 is generated, and when "if_w<min" is true block 586 is generated. If i is even, block 584 is generated, and if i is odd, block 585 is generated. FIG. 5I shows an example of control block 6, which generates block 592 using include statement 590. FIG. 5J shows an example of a design of a transistor that is generated using the virtual shapes of FIGS. 5A through 5I.

Figure 6:
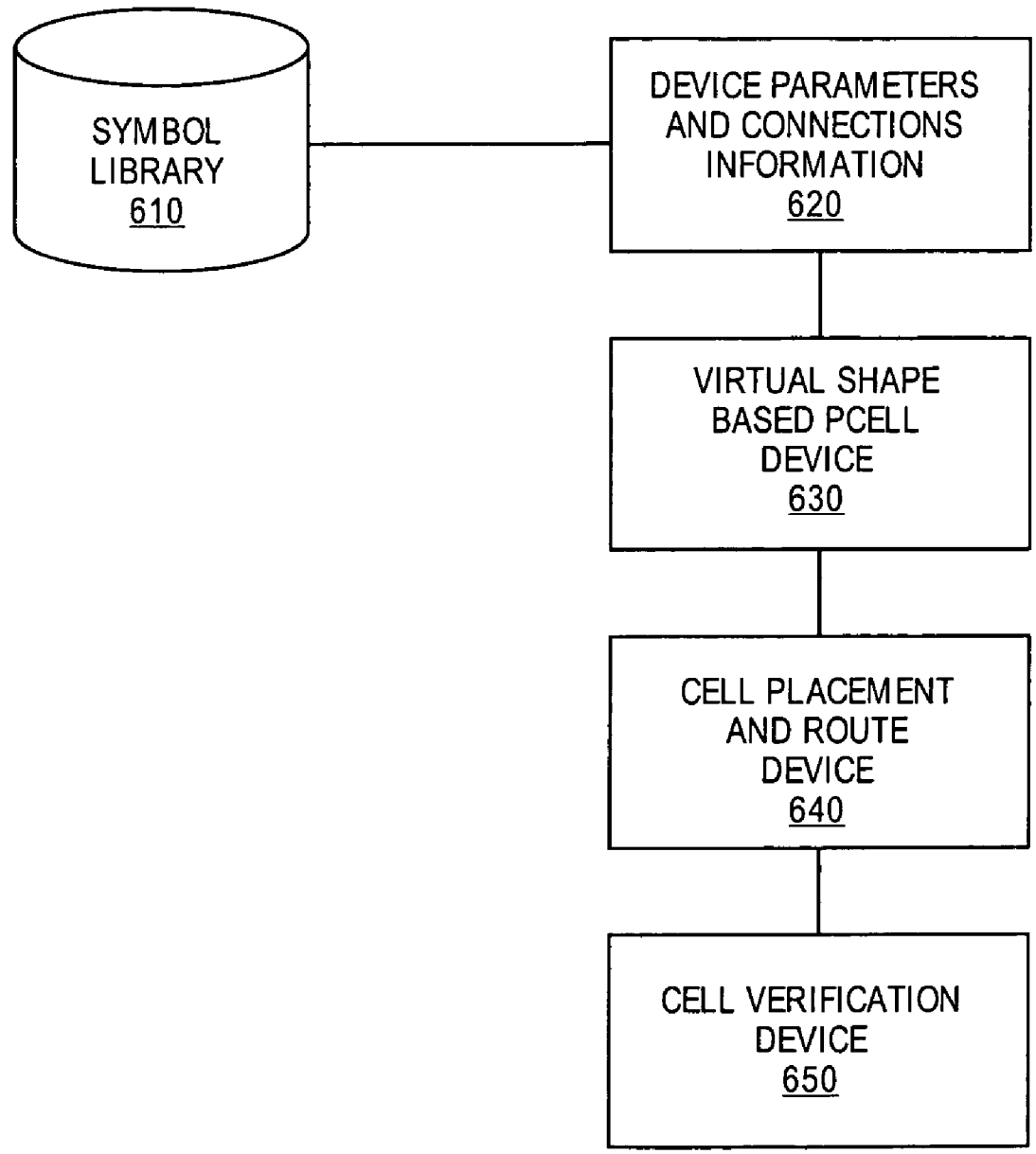
FIG. 6 shows an example of a system to automatically generate and verify a design for an electronic circuit using virtual shapes.

A design of an electronic circuit may include schematic symbols to provide a model for transistor-level simulation. With virtual shape based pcells, the schematic design information, which is in electronic form, can be passed seamlessly through to the physical design tools as shown in FIG. 6. Device parameters and connectivity data 620 are applied to symbols from symbol library 610 by the virtual shape based pcell device 630 to generate a schematic design of the electronic circuit. The virtual shape based pcell device 630 generates the components of the design using virtual pcells. A cell placement and route device 640 accesses the pcells to edit the layout and to route the components of the design. A cell verification device then applies verification rules to the design to determine whether the design is functional 650.

A method of designing an electronic circuit using one or more virtual shapes includes identifying a component of the circuit, the component having a plurality of parts, selecting a current design part of the component, determining a virtual shape based on the current design part, and generating a next design part of the component based on the virtual shape. The current design part has one or more shapes, and the virtual shape is determined based on the current design part. For example, determining the virtual shape may include naming one of the shapes for the current design part of the component using values, variables, or expressions, and the name may include zero or more indexes. The next design part may be determined by identifying a condition associated with the named shape, where the named shape contains the virtual shape, and, if the identified condition for the named shape is true, then generating the next design part based on the shape represented by the virtual shape. The next design part may also be generated by identifying an iteration associated with the named shape, where the named shape contains the virtual shape. The name and indexes of the virtual shape name are evaluated, and the next design part can then be generated based on the shape represented by the virtual shape. Generating the next design part may include identifying alignment points to the next design part using the virtual shape, and aligning the next design part with the current design part based on the alignment points. Virtual shapes can be used to create designs of components such as a resistor, where each design part is a design part of a resistor, or a multi-gate transistor, for example. After the next design part is created using the virtual shape, the process may continue by selecting another design part of the component as the current design part, then repeating determining the virtual shape based on the current design part, and generating the next design part of the component based on the virtual shape.

The method of designing the electronic circuit using one or more virtual shapes may be performed by executing a computer software program. The software program may be stored in a computer readable medium, such as an electronic memory device for example. The program may be executed by a computer processing system, such as a micro-processing device, for example. The processing system may include devices found in a computing system, such as input/output devices, internal and external communication devices and buses, and power source devices, for example. The processing system may be implemented with hardware logic, or a combination of hardware and software.

These and other embodiments of the present invention may be realized in accordance with the above teachings and it should be evident that various modifications and changes may be made to the above described embodiments without departing from the broader spirit and scope of the invention. The specification and drawings are, accordingly, to be regarded in an illustrative rather than restrictive sense and the invention measured only in terms of the claims.

The invention claimed is:

1. A computer implemented method of designing an electronic representation of a component of an electronic circuit design comprising:

identifying a component of the electronic circuit design, the component comprising one or more parts;

selecting a current design part of the component of the electronic circuit design;

representing the current design part in a representation of the component of the electronic circuit design by identifying, from a plurality of predetermined virtual shape candidates, a first virtual shape, in which each of the plurality of predetermined virtual shape candidates geometrically represents a different design part of the electronic circuit design, and the first virtual shape geometrically represents the current design part;

generating, using a computer which comprises a processor, a second virtual shape in the representation by selecting the second virtual shape from the plurality of predetermined virtual shape candidates, wherein the second virtual shape comprises an index that is used to select, from the plurality of predetermined virtual shape candidates, a next design part of the component of the electronic circuit design, in which the second virtual shape geometrically represents the next design part of the component, and the second virtual shape comprises an information which is used to connect the next design part to the current design part as represented by the first virtual shape in the representation of the component; and displaying a result of the act of generating the second virtual shape on a display apparatus or storing the result in a tangible computer readable medium.

2. The computer implemented method of claim 1, wherein the current design part comprises one or more first shapes, and wherein representing the current design part as the first virtual shape comprises:

naming the first virtual shape for the current design part of the component with a name including values, variables, or expressions with zero or more indexes.

3. The computer implemented method of claim 2 wherein the act of generating the second virtual shape comprising an index for the next design part further comprises:

identifying a condition associated with the first virtual shape; and if the identified condition for the at least one named shape is true, then generating the next design part based on the at least one named shape represented by the first virtual shape.

4. The computer implemented method of claim 2, wherein the act of generating the next design part further comprises:

identifying an iteration associated with the at least one named shape, wherein the at least one named shape contains the first virtual shape;

evaluating the name and indexes of the at least one named shape; and generating the next design part based on the at least one named shape represented by the first virtual shape.

5. The computer implemented method of claim 1 wherein the act of generating the next design part further comprises:
identifying an alignment point to the next design part using the second virtual shape; and aligning the next design part with the current design part based on the alignment point.

6. The computer implemented method of claim 1, wherein the component of the electronic circuit is a resistor, and each design part is a design part of a resistor.

7. The computer implemented method of claim 1, wherein the component of the electronic circuit is a multi-gate transistor.

8. The computer implemented method of claim 1, further comprising:
selecting one or more additional design parts of the component of the electronic circuit and, for each additional design part;
representing the additional design part as at least one additional virtual shape;
generating the additional design part of the component of the electronic circuit based on the at least one additional virtual shape; and
until all of the one or more additional design parts of the component are iteratively generated to generate the component of the electronic circuit.

9. The computer implemented method of claim 1, wherein the next design part has a same shape as the first virtual shape.

10. The computer implemented method of claim 1, wherein the first virtual shape provides information about a size, a location, an orientation or an alignment of the next design part of the component of the electronic circuit design.

11. The computer implemented method of claim 1, further comprising generating the next design part comprising reproducing a master shape, wherein the master shape is selected from a plurality of master shapes by applying an index value of the named virtual shape to a condition.

12. The computer implemented method of claim 1 being performed to automatically generate the electronic representation of the component of the electronic circuit design.

13. The computer implemented method of claim 1, in which the second virtual shape is identical to one of the first virtual shape.

14. An article of manufacture comprising a computer readable storage medium storing a computer software program which, when executed by a computer processor of a computer, causes the computer to perform a process of designing an electronic representation of a component of an electronic circuit design, the process comprising:
code to identify a component of the electronic circuit design, the component comprising one or more parts;
code to select a current design part of the component of the electronic circuit design;
code to represent the current design part in a representation of the component of the electronic circuit design by identifying, from a plurality of predetermined virtual shape candidates, a first virtual shape, in which each of the plurality of predetermined virtual shape candidates geometrically represents a different design part of the electronic circuit design, and the first virtual shape geometrically represents the current design part; and
code to generate, using a computer which comprises a processor, a second virtual shape in the representation by selecting the second virtual shape from the plurality of predetermined virtual shape candidates, wherein the second virtual shape comprises an index that is used to select, from the plurality of predetermined virtual shape candidates, a next design part of the component of the electronic circuit design, in which the second virtual shape geometrically represents the next design part of the component, and
the second virtual shape comprises an information which is used to connect the next design part to the current design part as represented by the first virtual shape in the representation of the component.

15. The article of manufacture of claim 14, wherein the current design part comprises one or more first shapes, and wherein the code to representing the current design part as the first virtual shape comprises:
code to name at least one of the first virtual shape for the current design part of the component of the electronic circuit with a name including values, variables, or expressions with zero or more indexes.

16. The article of manufacture of claim 14, wherein the code to generate the next design part further comprises:
code to identify an iteration associated with an at least one named shape, wherein the at least one named shape comprises the first virtual shape;
code to evaluate a name and one or more indexes of the at least one named shape; and
code to generate the next design part based on the at least one named shape represented by the first virtual shape.

17. The article of manufacture of claim 14, wherein the code to generate the next design part further comprises:
code to identify one or more alignment points to the current design part using the first virtual shape; and
code to align the next design part with the current design part based on the one or more alignment points.

18. The article of manufacture of claim 14, further comprising:
code to select one or more additional design parts of the component of the electronic circuit; and
code to repeat, for each additional design part, representing the additional design part as at least one additional virtual shape, and generating the additional design part of the component of the electronic circuit based on the at least one additional virtual shape, until all of the one or more additional design parts of the component are iteratively generated to generate the component of the electronic circuit.

19. The article of manufacture of claim 14, wherein the code to generate the next design part is based no a shape that is the same as the shape as the one or more named virtual shapes.

20. The article of manufacture of claim 14, wherein the code to represent the current design part is code to represent a virtual shape that provides information about a size, a location, an orientation or an alignment of the next design part of the component of the electronic circuit.

21. The article of manufacture of claim 14, wherein the code to generate the next design part reproduces a master shape selected from a plurality of master shapes by applying an index value of the first virtual shape to a condition.

22. The article of manufacture of claim 14 comprising code to automatically generate the electronic representation of the component of the electronic circuit.

23. An apparatus for designing an electronic representation of a component of an electronic circuit, comprising:
means for identifying a component of the electronic circuit design, the component comprising one or more parts;
means for selecting a current design part of the component of the electronic circuit design;

means for representing the current design part in a representation of the component of the electronic circuit design by identifying, from a plurality of predetermined virtual shape candidates, a first virtual shape, in which each of the plurality of predetermined virtual shape candidates geometrically represents a different design part of the electronic circuit design, and the first virtual shape geometrically represents the current design part;

means for generating a second virtual shape in the representation by selecting the second virtual shape from the plurality of predetermined virtual shape candidates, wherein the means for generating the second virtual shape comprises a processor of a computer, the second virtual shape comprises an index that is used to select, from the plurality of predetermined virtual shape candidates, a next design part of the component of the electronic circuit design, in which the second virtual shape geometrically represents the next design part of the component, and the second virtual shape comprise an information which is used to connect the next design part to the current design part as represented by the first virtual shape in the representation of the component; and a display apparatus configured for displaying a result generated by the means for generating the second virtual shape or a computer readable storage medium or a storage device configured for storing the result.

24. The apparatus of claim 23, wherein the current design part comprises one or more first shapes, and wherein said means for representing the current design part as the first virtual shape comprises:

means for naming at least one of multiple shapes for the current design part of the component with a name including values, variables, or expressions with zero or more indexes.

25. The apparatus of claim 24, wherein said means for generating the next design part further comprises:

means for identifying a condition associated with at least one named shape, wherein the at least one named shape contains at least one of the first virtual shape; and means for generating the next design part based on the at least one named shape represented by the at least one of the first virtual shape if the identified condition is true.

26. The apparatus of claim 24, wherein said means for generating further comprises:

means for identifying an iteration associated with the at least one named shape, wherein the at least one named shape contains the first virtual shape;

means for evaluating the name and indexes of the at least one named shape; and means for generating the next design part based on the at least one named shape represented by the first virtual shape.

27. The apparatus of claim 23, wherein said means for generating the next design part further comprises:

means for identifying alignment points to the current design part using the first virtual shape; and means for aligning the next design part with the current design part based on the alignment points.

28. The apparatus of claim 23, further comprising:
means for selecting additional design parts of the component of the electronic circuit; and means for repeating, for each additional design part, representing the additional design part as at least one additional virtual shape, and generating the additional design part of the component of the electronic circuit based on the at least one additional virtual shape, until all of the design parts of the component are iteratively generated to generate the component of the electronic circuit.

29. The apparatus of claim 23, wherein the means for generating the next design part generates a next design part having the same shape as the one or more named virtual shapes.

30. The apparatus of claim 23, wherein the means for representing the current design part comprises means for representing a virtual shape that provides information about a size, a location, an orientation or an alignment of the next design part of the component of the electronic circuit.

31. The apparatus of claim 23, wherein the means for generating a second virtual shape comprising an index for an next design part reproduces a master shape selected from a plurality of master shapes by applying an index value of the first virtual shape to a condition.

32. The apparatus of claim 23 being capable of automatically generating the electronic representation of the component of the electronic circuit.

33. A computer implemented method of generating an electronic design of a component of an electronic circuit comprising:

identifying a component of the electronic circuit design, the component comprising one or more parts;

selecting a current design part of the component of the electronic circuit design;

representing the current design part in a representation of the component of the electronic circuit design by identifying, from a plurality of predetermined virtual shape candidates, a named virtual shape, in which each of the plurality of predetermined virtual shape candidates geometrically represents a different design part of the electronic circuit design, and the first virtual shape geometrically represents the current design part, and the named virtual shape comprising a name generated with values, variables, or expressions with zero or more indexes, wherein the named virtual shape provides information about the component of the electronic circuit;

generating, using a computer which comprises a processor, a second virtual shape in the representation by selecting the second virtual shape from the plurality of predetermined virtual shape candidates, wherein the second virtual shape comprises an index which is used to select, from the plurality of predetermined virtual shape candidates, a next design part of the component of the electronic circuit design, in which the second virtual shape geometrically represents the next design part of the component, and the second virtual shape comprises an information which is used to connect the next design part to the current design part as represented by the named virtual shape in the representation of the component; and displaying a result of the act of generating the second virtual shape on a display apparatus or storing the result in a tangible computer readable storage medium.

34. The computer implemented method of claim 33 wherein generating the next design part further comprises:

identifying a condition associated parts containing a reference to the one or more named shapes; and if the identified condition for an associated part is true, then generating the next design part based on a shape represented by the one or more named virtual shapes.

35. The computer implemented of claim 33, further comprising:

identifying associated parts containing the reference to the one or more named shapes; and
evaluating the name and indexes included in the name of the one or more named virtual shapes; and
iteratively generating the next design part based on a shape represented by the one or more named virtual shapes until all of the design parts of the component are generated to generate the component of the electronic circuit.

36. The computer implemented method of claim 33 wherein the act of generating the next design part further comprises:
identifying alignment points to the next design part using the one or more named virtual shapes; and
aligning the next design part with the current design part based on these alignments points.

37. The computer implemented method of claim 33, wherein the one or more named virtual shapes provide information about a size, a location, an orientation or an alignment of the next design part of the component of the electronic circuit.

38. The computer implemented method of claim 33, generating the next design part comprising reproducing a master shape selected from a plurality of master shapes by applying an index value of the one or more named virtual shapes to a condition.

39. The computer implemented method of claim 33 being performed to automatically generate the electronic representation of the component of the electronic circuit design.

40. A system for generating an electronic design of a component of an electronic circuit, comprising:
means for identifying a component of the electronic circuit design, the component comprising one or more parts;
means for selecting a current design part of the component of the electronic circuit design;
means for representing the current design part in a representation of the component of the electronic circuit design by identifying, from a plurality of predetermined virtual shape candidates, a named virtual shape, in which,
each of the plurality of predetermined virtual shape candidates geometrically represents a different design part of the electronic circuit design, and the first virtual shape geometrically represents the current design part, and
the named virtual shape comprising a name generated with values, variables, or expressions with zero or more indexes, wherein the named virtual shape provides information about the component of the electronic circuit;
means for generating a second virtual shape in the representation by selecting the second virtual shape from the plurality of predetermined virtual shape candidates, wherein
the means for generating the second virtual shape comprises a processor of a computer,
the second virtual shape comprises an index which is used to select, from the plurality of predetermined virtual shape candidates, a next design part of the component of the electronic circuit design in which the second virtual shape geometrically represents the next design part of the component, and
the second virtual shape comprises an information which is used to connect the next design part to the current design part as represented by the named virtual shape in the representation of the component; and
a display apparatus configured for displaying a result of the act of generating the second virtual shape or a computer readable storage medium or a storage device configured for storing the result.

41. The system of claim 40, further comprising:
means for identifying a condition associated parts containing a reference to the one or more named shapes; and
if the identified condition for an associated part is true, then means for generating the next design part based on the shape represented by the one or more named virtual shapes.

42. The system of claim 40, further comprising:
means for identifying associated parts containing the reference to the one or more named shapes; and
means for evaluating the name and indexes included in the name of the one or more named virtual shapes; and
means for iteratively generating the next design part based on the shape represented by the one or more named virtual shapes until all of the design parts of the component are generated to generate the component of the electronic circuit.

43. An article of manufacture comprising a computer readable medium storing thereupon a computer software program which, when executed by a computer processor of a computer, causes the computer to perform a process for generating an electronic design of a component of an electronic circuit, the process comprising:
identifying a current design part of a component of the electronic circuit design, the component comprising one or more parts;
selecting a current design part of the component of the electronic circuit design;
representing the current design part in a representation of the component of the electronic circuit design by identifying, from a plurality of predetermined virtual shape candidates, a named virtual shape, in which
each of the plurality of predetermined virtual shape candidates geometrically represents a different design part of the electronic circuit design, and the first virtual shape geometrically represents the current design part, and
the named virtual shape comprising a name generated with values, variables, or expressions with zero or more indexes, wherein the named virtual shape provides information about the component of the electronic circuit; and
generating, using a computer which comprises a processor, a second virtual shape in the representation by selecting the second virtual shape from the plurality of predetermined virtual shape candidates, wherein
the second virtual shape comprises an index which is used to select, from the plurality of predetermined virtual shape candidates, a next design part of the component of the electronic circuit design, in which the second virtual shape geometrically represents the next design part of the component, and
the second virtual shape comprises an information which is used to connect the next design part to the current design part as represented by the named virtual shape in the representation of the component; and
displaying a result of the act of generating the second virtual shape on a display apparatus or storing the result in a tangible computer readable storage medium.

* * * * *